(12) United States Patent
Liao (10) Patent No.: US 11,475,699 B2
(45) Date of Patent: Oct. 18, 2022

(54) DISPLAY MODULE AND IMAGE DISPLAY THEREOF

(71) Applicant: ASTI GLOBAL INC., TAIWAN, Taichung (TW)

(72) Inventor: Chien-Shou Liao, Taichung (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 107 days.

(21) Appl. No.: 17/202,364

(22) Filed: Mar. 16, 2021

(65) Prior Publication Data

US 2021/0224506 A1 Jul. 22, 2021

Related U.S. Application Data

(63) Continuation-in-part of application No. 15/931,884, filed on May 14, 2020, now abandoned.

(60) Provisional application No. 63/120,221, filed on Dec. 2, 2020.

(30) Foreign Application Priority Data

Jan. 22, 2020 (TW) .................................. 109102380

(51) Int. Cl.
*G06V 40/13* (2022.01)
*H01L 27/32* (2006.01)
*G02F 1/1333* (2006.01)
*G06F 1/16* (2006.01)

(52) U.S. Cl.
CPC ...... *G06V 40/1318* (2022.01); *G02F 1/13338* (2013.01); *G06F 1/1605* (2013.01); *H01L 27/3227* (2013.01)

(58) Field of Classification Search
CPC ............. G02F 1/13338; G02F 1/13312; G06F 1/1637; G06F 1/1626; G06F 3/0304; G06F 1/1605; G06F 1/1684; H01L 27/3227; G06V 40/1318
See application file for complete search history.

(56) References Cited

U.S. PATENT DOCUMENTS

| 7,133,032 | B2 | 11/2006 | Cok | |
|---|---|---|---|---|
| 8,178,828 | B2 | 5/2012 | Yamaguchi | |
| 10,509,937 | B2 | 12/2019 | Lee | |
| 10,976,207 | B2 * | 4/2021 | Peele | G01L 1/24 |
| 10,978,523 | B2 * | 4/2021 | Park | H01L 31/105 |
| 11,048,910 | B2 * | 6/2021 | Li | G06V 10/82 |
| 11,106,078 | B2 * | 8/2021 | Zhang | G02F 1/13338 |
| 2014/0104396 | A1 | 4/2014 | Salow | |
| 2015/0186093 | A1 | 7/2015 | Kim | |

(Continued)

FOREIGN PATENT DOCUMENTS

| CN | 107610596 A | | 1/2018 | |
|---|---|---|---|---|
| CN | 210091193 U | * | 2/2020 | G02B 5/201 |

(Continued)

*Primary Examiner* — Vinh T Lam
(74) *Attorney, Agent, or Firm* — Winston Hsu (57) ABSTRACT

A display module includes a circuit substrate, a plurality of image display units and at least one optical sensor. The plurality of image display units is disposed on the circuit substrate in a matrix arrangement. The at least one optical sensor is disposed at a position of the circuit substrate where there is no image display unit disposed thereon. A quantity ratio of the image display units and the at least one optical sensor is between 1 and 100000.

21 Claims, 6 Drawing Sheets

(56) References Cited

U.S. PATENT DOCUMENTS

| | | | |
|---|---|---|---|
| 2017/0251137 A1 | 8/2017 | Evans, V | |
| 2019/0348480 A1 | 11/2019 | Wu | |
| 2020/0035729 A1 | 1/2020 | Lee | |
| 2020/0057525 A1 | 2/2020 | Prest | |
| 2020/0093014 A1 | 3/2020 | Merenda | |
| 2020/0327300 A1 | 10/2020 | He | |
| 2020/0394983 A1 | 12/2020 | Huang | |
| 2021/0134128 A1 | 5/2021 | Atkinson | |
| 2021/0296409 A1 | 9/2021 | Yamazaki | |
| 2022/0103765 A1 * | 3/2022 | Martinsson | ............ G06F 21/32 |

FOREIGN PATENT DOCUMENTS

| | | | | |
|---|---|---|---|---|
| CN | 210488569 U | * | 5/2020 | ............ G02B 5/201 |
| CN | 211404504 U | * | 9/2020 | ....... H01L 27/14621 |
| CN | 211529173 U | * | 9/2020 | |
| EP | 3748534 A1 | * | 12/2020 | ............ G02B 5/201 |
| TW | 200504571 | | 2/2005 | |
| TW | 200743079 | | 11/2007 | |
| TW | 200950121 A1 | | 12/2009 | |
| TW | 201836137 A | | 10/2018 | |
| TW | I658392 B | | 5/2019 | |
| TW | M590701 U | | 2/2020 | |
| TW | M603199 U | | 10/2020 | |
| WO | 2020/008801 A1 | | 1/2020 | |
| WO | WO-2020118620 A1 | * | 6/2020 | ............ G02B 5/201 |
| WO | WO-2020119330 A1 | * | 6/2020 | ............ G02B 5/201 |

* cited by examiner

DISPLAY MODULE AND IMAGE DISPLAY THEREOF

CROSS REFERENCE TO RELATED APPLICATIONS

This application is a continuation in part of U.S. application Ser. No. 15/931,884 filed on May 14, 2020, claims the benefit of U.S. Provisional Application No. 63/120,221, which was filed on Dec. 2, 2020, and is incorporated herein by reference.

BACKGROUND OF THE INVENTION

1. Field of the Invention

The present disclosure relates to a display module and an image display thereof, and more particularly to a display module disposing image display units and at least one optical sensor on the same circuit substrate and an image display thereof.

2. Description of the Prior Art

A conventional portable electronic device includes a display module and an optical sensor module. However, since the display module and the optical sensor module are respectively arranged on two different regions of a PCB, a display region provided by the display module is unavoidably reduced to allow for the optical sensor module to be arranged on an optical sensor region.

SUMMARY OF THE INVENTION

In response to the above-referenced technical inadequacies, the present disclosure provides a display module disposing image display units and at least one optical sensor on the same circuit substrate and an image display thereof.

The present disclosure provides a display module including a circuit substrate, a plurality of image display units, and at least one optical sensor. The plurality of image display units is disposed on the circuit substrate in a matrix arrangement. The at least one optical sensor is disposed at a position of the circuit substrate where there is no image display unit disposed thereon. A quantity ratio of the plurality of image display units and the at least one optical sensor is between 1 and 100000.

The present disclosure further provides an image display including a display module. The display module includes a circuit substrate, a plurality of image display units, and at least one optical sensor. The plurality of image display units is disposed on the circuit substrate in a matrix arrangement. The at least one optical sensor is disposed at a position of the circuit substrate where there is no image display unit disposed thereon. A quantity ratio of the plurality of image display units and the at least one optical sensor is between 1 and 100000.

These and other objectives of the present invention will no doubt become obvious to those of ordinary skill in the art after reading the following detailed description of the preferred embodiment that is illustrated in the various figures and drawings.

DETAILED DESCRIPTION

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
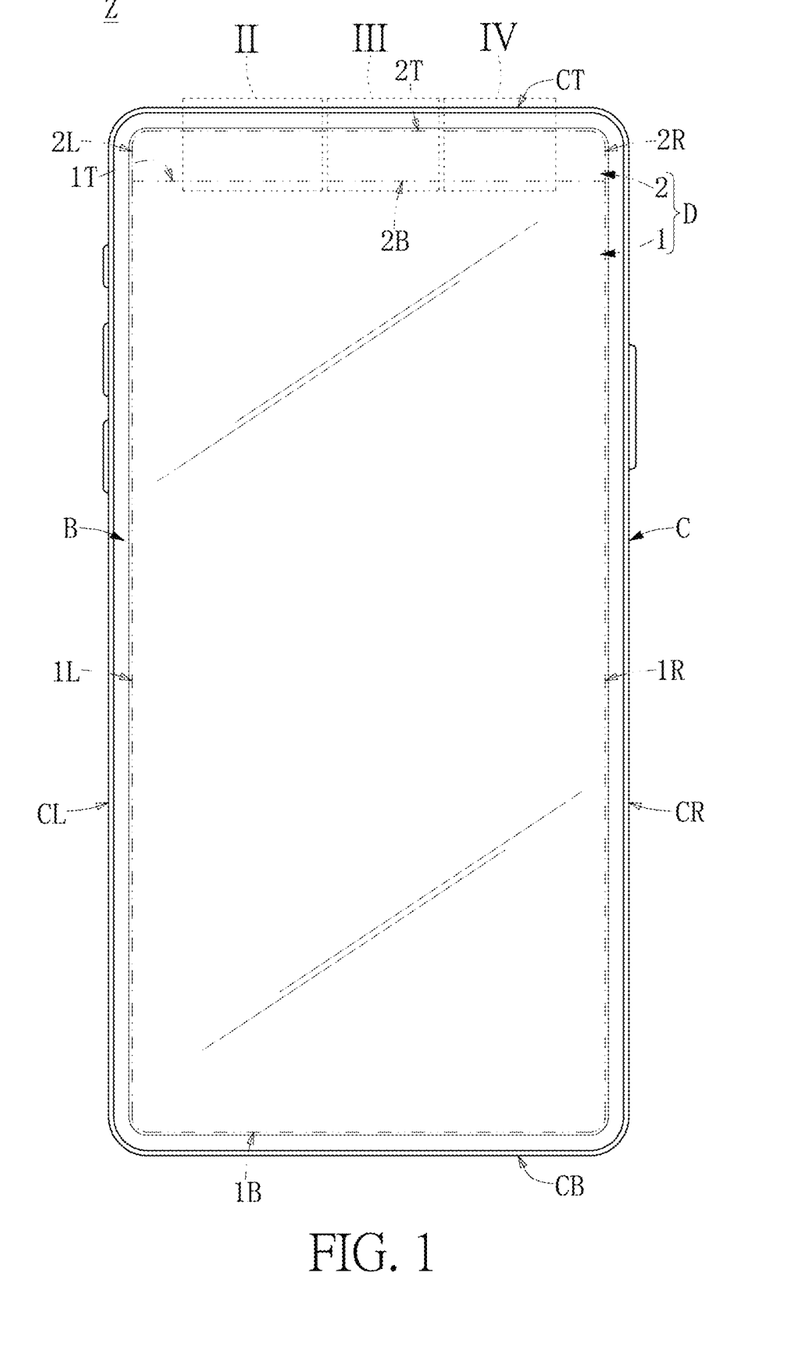
FIG. 1 is a schematic view of a portable electronic device according to a first embodiment of the present disclosure and a full-screen image display according to a second embodiment of the present disclosure.

Referring to FIG. 1, a first embodiment of the present disclosure provides a portable electronic device Z including a frame structure C and a full-screen image display D surrounded by the frame structure C, and the full-screen image display D includes a first display module 1 for providing a first image, and a second display module 2 for providing a second image. In addition, the first display module 1 and the second display module 2 can be adjacent or connected to each other, so that the first image generated by the first display module 1 and the second image generated by the second display module 2 can be combined to form a continuous image.

For example, as shown in FIG. 1, the frame structure C has a left side CL, a right side CR, a top side CT and a bottom side CB, the first display module 1 has a left side 1L, a right side 1R, a top side 1T and a bottom side 1B, and the second display module 2 has a left side 2L, a right side 2R, a top side 2T and a bottom side 2B. In addition, the left side 1L of the first display module 1 is close or very close to the left side CL of the frame structure C, so that no exposed electronic element (such as image capturers, or sensors, etc.) is disposed between the left side 1L of the first display module 1 and the left side CL of the frame structure C (that is to say, there is an unoccupied region between the left side 1L of the first display module 1 and the left side CL of the frame structure C). The right side 1R of the first display module 1 is close or very close to the right side CR of the frame structure C, so that no exposed electronic element (such as an unoccupied region) is disposed between the right side 1R of the first display module 1 and the right side CR of the frame structure C. The bottom side 1B of the first display module 1 is close or very close to the bottom side CB of the frame structure C, so that no exposed electronic element (such as an unoccupied region) is disposed between the bottom side 1B of the first display module 1 and the bottom side CB of the frame structure C. Moreover, the left side 2L of the second display module 2 is close or very close to the left side CL of the frame structure C, so that no exposed electronic element (such as an unoccupied region) is disposed between the left side 2L of the second display module 2 and the left side CL of the frame structure C. The right side 2R of the second display module 2 is close or very close to the right side CR of the frame structure C, so that no exposed electronic element (such as an unoccupied region) is disposed between the right side 2R of the second display module 2 and the right side CR of the frame structure C. The bottom side 2T of the second display module 2 is close or very close to the bottom side CT of the frame structure C, so that no exposed electronic element (such as an unoccupied region) is disposed between the bottom side 2T of the second display module 2 and the bottom side CT of the frame structure C. It should be noted that the top side 1T of the first display module 1 and the bottom side 2B of the second display module 2 can be adjacent or connected to each other. However, the aforementioned description of the first embodiment is merely an example and is not meant to limit the scope of the present disclosure.

For example, as shown in FIG. 1, the portable electronic device Z includes a surrounding light-shading layer B that is a continuous shape without any through hole. The first display module 1 and the second display module 2 can be surrounded by the surrounding light-shading layer B, and the surrounding light-shading layer B can be surrounded by the frame structure C. Therefore, a first region connected between the first display module 1 and the frame structure C can be shaded by the surrounding light-shading layer B, so that no exposed electronic element (such as image capturers, or sensors, etc.) is disposed on the first region connected between the first display module 1 and the frame structure C. In addition, a second region connected between the second display module 2 and the frame structure C can be shaded by the surrounding light-shading layer B, so that no exposed electronic element (such as image capturers, or sensors, etc.) is disposed on the second region connected between the second display module 2 and the frame structure C. However, the aforementioned description of the first embodiment is merely an example and is not meant to limit the scope of the present disclosure.

Second Embodiment

Referring to FIG. 1 to FIG. 6, a second embodiment of the present disclosure provides a full-screen image display D, including a first display module 1 for providing a first image, and a second display module 2 for providing a second image.

For example, the first display module 1 may be an organic LED (OLED) display, a liquid crystal display (LCD), an LED display or any type of first display for providing a first image, and the second display module 2 may be an LED display or any type of second display for providing a second. In addition, the first display module 1 and the second display module 2 can be adjacent or connected to each other, so that the first image generated by the first display module 1 and the second image generated by the second display module 2 can be combined to form a continuous image. However, the aforementioned description of the second embodiment is merely an example and is not meant to limit the scope of the present disclosure.

For example, referring to FIG. 1 to FIG. 4, the second display module 2 includes a circuit substrate 20, an image display unit 21 disposed on the circuit substrate 20, and a plurality of electronic units disposed on the circuit substrate 20. In addition, the electronic units can be divided into a light-sensing unit, a light-projecting unit, an image-capturing unit and an audio signal transmitting unit, and image display unit 21, the light-sensing unit, the light-projecting unit, the image-capturing unit and the audio signal transmitting unit are disposed on the circuit substrate 20. It should be noted that the image display unit 21 includes a plurality of LED chips 210 disposed on the circuit substrate 20, and the second image can be provided by the LED chips 210. However, the aforementioned description of the second embodiment is merely an example and is not meant to limit the scope of the present disclosure.

Figure 2:
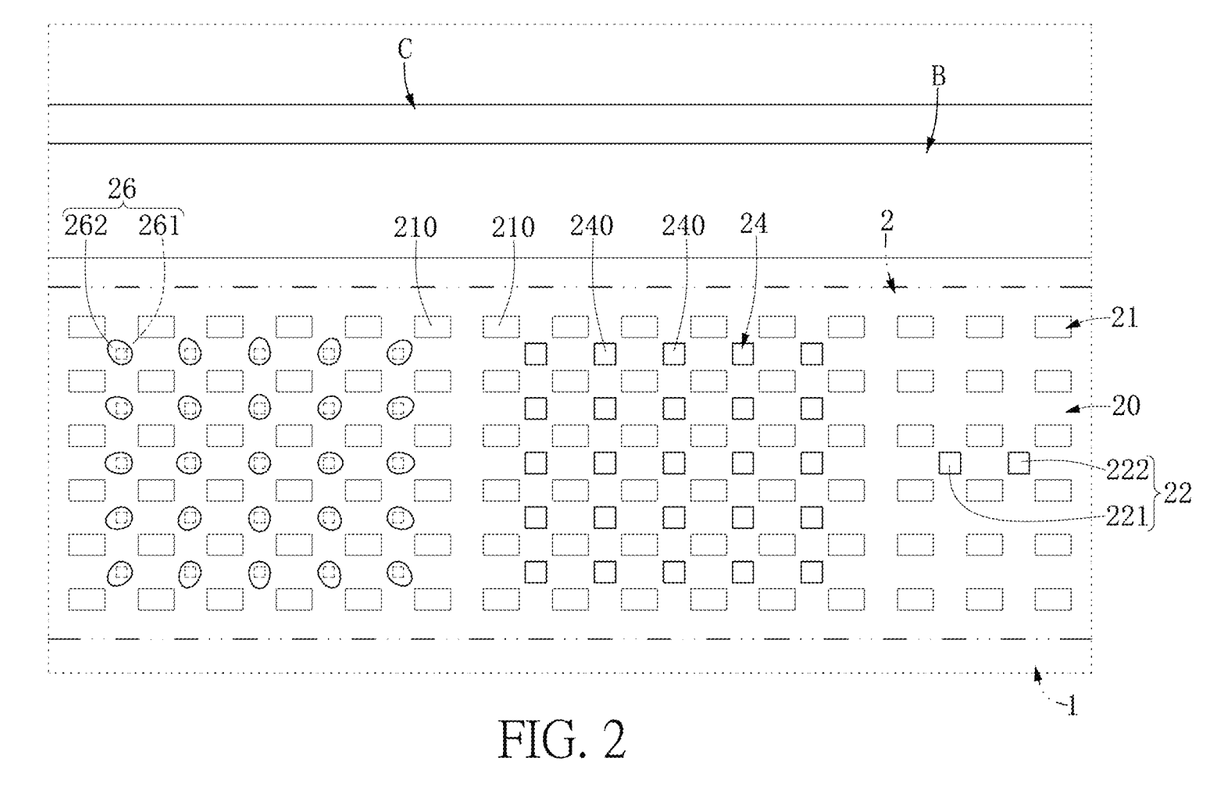
FIG. 2 shows an enlarged view of part I of FIG. 1.
Figure 3:
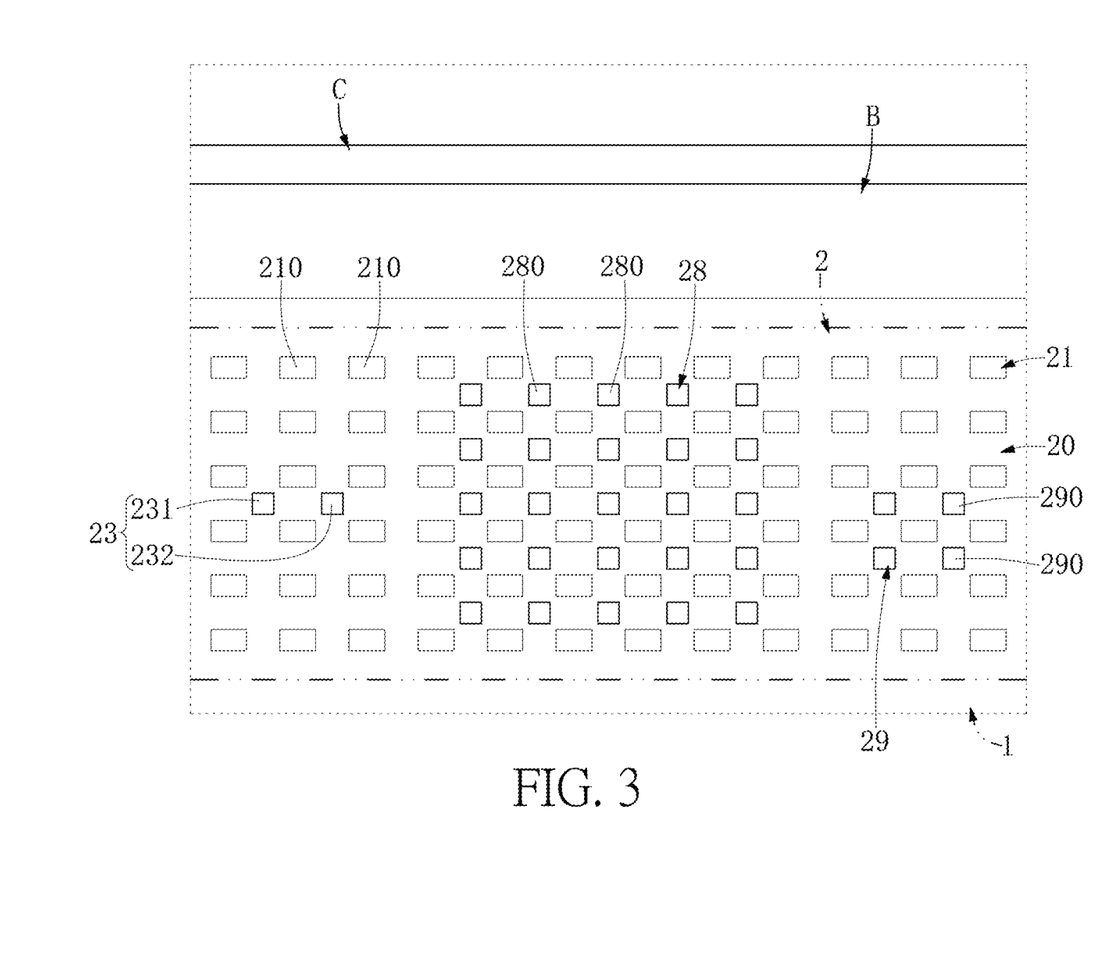
FIG. 3 shows an enlarged view of part III of FIG. 1.

For example, referring to FIG. 1 to FIG. 3, the light-sensing unit includes an ambient light sensor 22 disposed on the circuit substrate 20 and a proximity sensor 23 disposed on the circuit substrate 20. In addition, the ambient light sensor 22 includes a first light generating chip 221 for generating a first light source and a first light receiving chip 222 for receiving the first light source that has been reflected, and the ambient light sensor 22 can provide an ambient brightness information by cooperation of the first light generating chip 221 and the first light receiving chip 222. Moreover, the proximity sensor 23 includes a second light generating chip 231 for generating a second light source and a second light receiving chip 232 for receiving the second light source that has been reflected, and the proximity sensor 23 can provide a depth information of field by cooperation of the second light generating chip 231 and the second light receiving chip 232. Furthermore, the first light generating chip 221 can be disposed between any two adjacent ones of the LED chips 210, and the first light receiving chip 222 can be disposed between any two adjacent ones of the LED chips 210. The second light generating chip 231 can be disposed between any two adjacent ones of the LED chips 210, and the second light receiving chip 232 can be disposed between any two adjacent ones of the LED chips 210. However, the aforementioned description of the second embodiment is merely an example and is not meant to limit the scope of the present disclosure.

Figure 4:
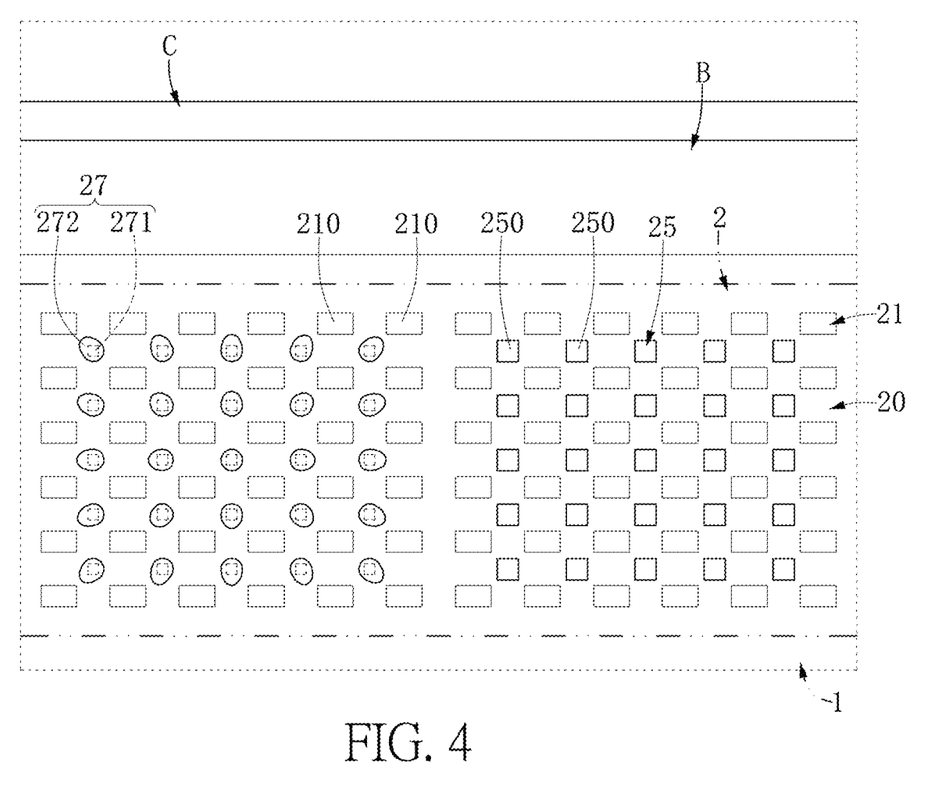
FIG. 4 shows an enlarged view of part IV of FIG. 1.

For example, referring to FIG. 1, FIG. 2 and FIG. 4, the light-projecting unit includes a flood illuminator 24 disposed on the circuit substrate 20 and a dot projector 25 disposed on the circuit substrate 20. The flood illuminator 24 includes a plurality of infrared (IR) light generating chips 240 that are arranged to form a first predetermined shape, and the dot projector 25 includes a plurality of invisible light generating chips 250 that are arranged to form a second predetermined shape. In addition, each of the infrared light generating chips 240 can be disposed between any two adjacent ones of the LED chips 210, and each of the invisible light generating chips 250 can be disposed between any two adjacent ones of the LED chips 210. However, the aforementioned description of the second embodiment is merely an example and is not meant to limit the scope of the present disclosure.

For example, referring to FIG. 1, FIG. 2 and FIG. 4, the image-capturing unit includes a first image capturer 26 (such as an image capturing device) disposed on the circuit substrate 20 and a second image capturer 27 disposed on the circuit substrate 20. In addition, the first image capturer 26 may be an infrared camera, and the first image capturer 26 includes a plurality of first image-capturing chips 261 for capturing invisible light and a plurality of first optical lenses 262 (such as a first optical assembly) respectively disposed above the first image-capturing chips 261. Moreover, the second image capturer 27 may be a front camera, and the second image capturer 27 includes a plurality of second image-capturing chips 271 for capturing visible light and a plurality of second optical lenses 272 (such as a second optical assembly) respectively disposed above the second image-capturing chips 271. Furthermore, each of the first image-capturing chips 261 can be disposed between any two adjacent ones of the LED chips 210, and each of the second image-capturing chips 271 can be disposed between any two adjacent ones of the LED chips 210. However, the aforementioned description of the second embodiment is merely an example and is not meant to limit the scope of the present disclosure.

For example, referring to FIG. 1 and FIG. 3, the audio signal transmitting unit includes a speaker 28 disposed on the circuit substrate 20 and a microphone 29 disposed on the circuit substrate 20. In addition, the speaker 28 includes a plurality of audio signal generating chips 280 that are arranged to form a first predetermined shape, and the microphone 29 includes a plurality of audio signal receiving chips 290 that are arranged to form a second predetermined shape. Moreover, each of the audio signal generating chips 280 can be disposed between any two adjacent ones of the LED chips 210, and each of the audio signal receiving chips 290 can be disposed between any two adjacent ones of the LED chips 210. However, the aforementioned description of the second embodiment is merely an example and is not meant to limit the scope of the present disclosure.

To be noted, the component configuration of the display module provided by the present disclosure is not limited to the aforesaid embodiments, which means the present disclosure could adopt the design of disposing at least one optical sensor at a position of the circuit substrate where there is no image display unit disposed thereon (e.g. the optical sensor could be disposed between any two adjacent image display units, but not limited thereto) in another embodiment for integrating the optical sensor and the image display units into the same region of the circuit substrate. As such, the present disclosure can solve the prior art problem that the optical sensor module (e.g. a front camera, an infrared light projecting sensor, a fingerprint reader and so on) and the display module are respectively arranged on two different regions of a PCB.

That is, in another embodiment, the image display of the present disclosure could include one single display module (but not limited thereto; for example, the image display of the present disclosure could include two display modules (e.g. the first display module 1 and the second display module 2 in FIG. 1) connected to each other mentioned in the aforesaid embodiments). The image display in this embodiment could include the circuit substrate, a plurality of image display units (e.g. LED chips, but not limited thereto) disposed on the circuit substrate in a matrix arrangement and at least one optical sensor (e.g. a light-sensing CMOS (Complementary Metal-Oxide-Semiconductor) chip, but not limited thereto) disposed at a position of the circuit substrate where there is no image display unit disposed thereon. As for the other related description for this embodiment (e.g. the arrangement design for disposing the optical sensor and the image display units on the circuit substrate, the panel type of the display module, etc.), it could be reasoned by analogy according to the aforesaid embodiments and omitted herein.

In the practical application, the quantity ratio of the image display units and the optical sensor could be preferably between 1 and 1000000. For example, in the application that the optical sensor is an image capturing unit to be integrated on the circuit substrate cooperatively with the image display units (e.g. the image capturing unit could be 50 thousand CMOS chips (each CMOS chip could have a 20*20 pixel matrix) to form a 20-million-pixel front camera and the image display units could be 2.1 million LED chips, such as red, green, and blue micro LED chips, to provide an image display function having a resolution of 2000*350 pixels), the quantity ratio of the image display units and the optical sensor is equal to 42 (i.e. 2100000/50000). That is to say, in the aforesaid integration application, the quantity ratio of the image display units and the optical sensor on the circuit substrate could be between 10 and 100, but not limited thereto.

Furthermore, in the application that the optical sensor is a light-projecting unit, a light-sensing unit, or the combination thereof to be integrated on the circuit substrate cooperatively with the image display units (e.g. the combination of the light-projecting unit and the light-sensing unit could be 3.5 thousand CMOS chips (each CMOS chip could have a 20*20 pixel matrix) to form a 1.4-million-pixel infrared light projecting sensor and the image display units could be 2.1 million LED chips, such as red, green, and blue micro LED chips, to provide an image display function having a resolution of 2000*350 pixels), the quantity ratio of the image display units and the optical sensor is equal to 600 (i.e. 2100000/3500). That is to say, in the aforesaid integration application, the quantity ratio of the image display units and the optical sensor on the circuit substrate could be between 100 and 1000, but not limited thereto.

Moreover, in the application that the optical sensor is a fingerprint reading component to be integrated on the circuit substrate cooperatively with the image display units (e.g. the optical sensor could be 400 CMOS chips (each CMOS chip could have a 20*20 pixel matrix) to form a 160-thousand-pixel fingerprint reader and the image display units could be 2.1 million LED chips, such as red, green, and blue micro LED chips, to provide an image display function having a resolution of 2000*350 pixels), the quantity ratio of the image display units and the optical sensor is equal to 5250 (i.e. 2100000/400). That is to say, in the aforesaid integration application, the quantity ratio of the image display units and the optical sensor on the circuit substrate could be between 1000 and 10000, but not limited thereto.

Figure 5:
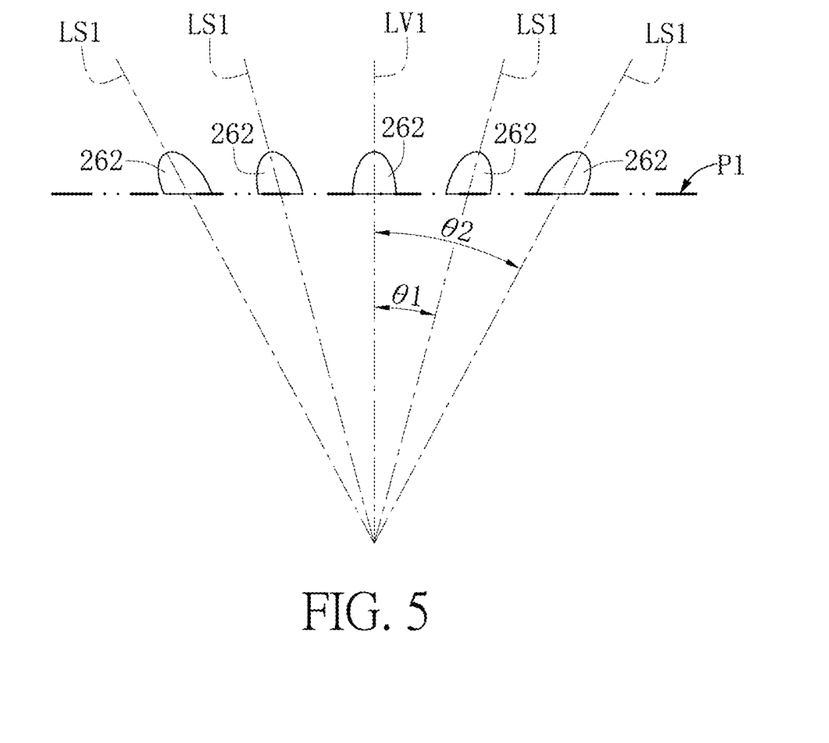
FIG. 5 is a lateral schematic view of a plurality of first optical lenses of a first image capturer of the full-screen image display according to the second embodiment of the present disclosure.

It should be noted that the first optical lenses 262 can be arranged separate from each other and disposed on a first plane P1, and the first optical lenses 262 can be gradually outwardly inclined from inner to outer circle (from inner circle to outer circle) as shown in FIG. 2 and FIG. 5 (for example, the first optical lenses 262 can be gradually inclined outwardly in a centrifugal and bottom-up direction from an inner circle to an outer circle thereof). In addition, at least one of the first optical lenses 262 has a first vertical optical axis LV1, each of the other first optical lenses 262 has a first inclined optical axis LS1. Moreover, the first vertical optical axis LV1 of the at least one first optical lens 262 and the first inclined optical axis LS1 of each of the other first optical lenses 262 are intersected (or alternated) with each other, and the angles (θ1, θ2) of the first inclined optical axes LS1 of the other first optical lenses 262 relative to the first vertical optical axis LV1 of the at least one first optical lens 262 are gradually increased from the inner circle to the outer circle of the first optical lenses 262 (that is to say θ1<θ2). More particularly, a part of a complete image can be captured by cooperation of the corresponding first image-capturing chip 261 and the corresponding first optical lenses 262, so that the complete image can be obtained by cooperation of all of the first image-capturing chips 261 and all of the first optical lenses 262.

Figure 6:
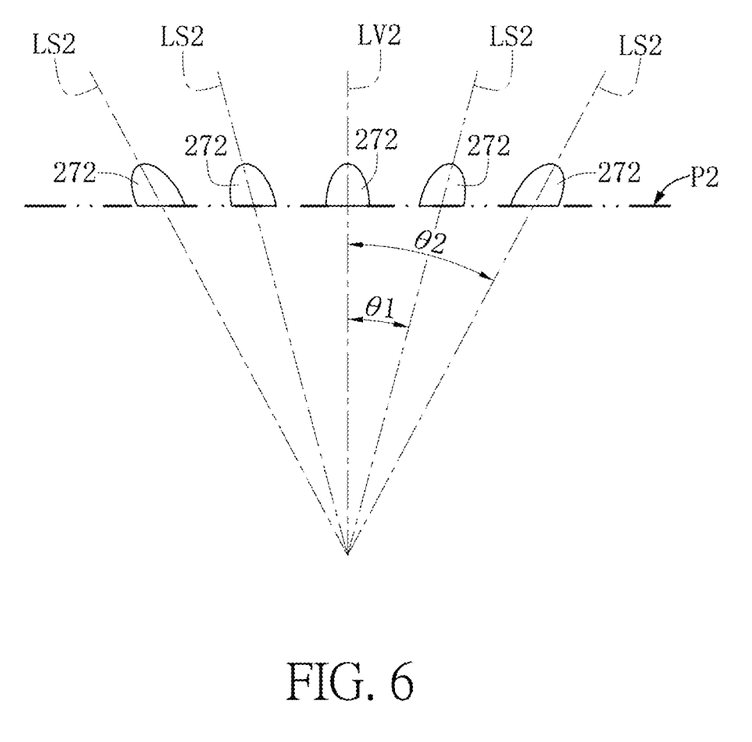
FIG. 6 is a lateral schematic view of a plurality of second optical lenses of a second image capturer of the full-screen image display according to the second embodiment of the present disclosure.

It should be noted that the second optical lenses 272 can be arranged separate from each other and disposed on a second plane P2, and the second optical lenses 272 can be gradually outwardly inclined from inner to outer circle (from inner circle to outer circle) as shown in FIG. 4 and FIG. 6 (for example, the second optical lenses 272 can be gradually inclined outwardly in a centrifugal and bottom-up direction from an inner circle to an outer circle thereof). In addition, at least one of the second optical lenses 272 has a second vertical optical axis LV2, each of the other second optical lenses 262 has a second inclined optical axis LS2. Moreover, the second vertical optical axis LV2 of the at least one second optical lens 272 and the second inclined optical axis LS2 of each of the other second optical lenses 272 are intersected (or alternated) with each other, and the angles (θ1, θ2) of the second inclined optical axes LS2 of the other second optical lenses 272 relative to the second vertical optical axis LV2 of the at least one second optical lens 272 are gradually increased from the inner circle to the outer circle of the second optical lenses 272 (that is to say θ1<θ2). More particularly, a part of a complete image can be captured by cooperation of the corresponding second image-capturing chip 271 and the corresponding second optical lenses 272, so that the complete image can be obtained by cooperation of all of the second image-capturing chips 271 and all of the second optical lenses 272.

In conclusion, by virtue of "a first display module 1 for providing a first image, and a second display module 2 for providing a second image", "the first display module 1 and the second display module 2 being adjacent or connected to each other, and the first image and the second image being combined to form a continuous image", "the second display module 2 including a circuit substrate 20, an image display unit 21 disposed on the circuit substrate 20, and a plurality of electronic units disposed on the circuit substrate 20" and "the image display unit 21 including a plurality of LED chips 210 disposed on the circuit substrate 20, and the second image being provided by the LED chips 210", the electronic units can be arranged on an image display region that is occupied by the image display unit 21.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display module comprising:
   a circuit substrate;
   a plurality of image display units disposed on the circuit substrate in a matrix arrangement; and
   at least one optical sensor disposed at a position of the circuit substrate where there is no image display unit disposed thereon, a quantity ratio of the plurality of image display units and the at least one optical sensor being between 1 and 100000.

2. The display module of claim 1, wherein the image display unit is an LED chip.

3. The display module of claim 1, wherein the at least one optical sensor is an image-capturing unit.

4. The display module of claim 3, wherein the quantity ratio of the plurality of image display units and the at least one optical sensor is between 10 and 100.

5. The display module of claim 1, wherein the at least one optical sensor is a light-projecting unit, a light-sensing unit, or the combination thereof.

6. The display module of claim 5, wherein the quantity ratio of the plurality of image display units and the at least one optical sensor is between 100 and 1000.

7. The display module of claim 1, wherein the at least one optical sensor is a fingerprint reading component.

8. The display module of claim 7, wherein the quantity ratio of the plurality of image display units and the at least one optical sensor is between 1000 and 10000.

9. The display module of claim 1, wherein the at least one optical sensor is disposed between any two adjacent image display units.

10. An image display comprising:
    a display module comprising:
        a circuit substrate;
        a plurality of image display units disposed on the circuit substrate in a matrix arrangement; and
        at least one optical sensor disposed at a position of the circuit substrate where there is no image display unit disposed thereon, a quantity ratio of the plurality of image display units and the at least one optical sensor being between 1 and 100000.

11. The image display of claim 10, wherein the image display unit is an LED chip.

12. The image display of claim 10, wherein the at least one optical sensor is an image-capturing unit.

13. The image display of claim 12, wherein the quantity ratio of the plurality of image display units and the at least one optical sensor is between 10 and 100.

14. The image display of claim 10, wherein the at least one optical sensor is a light-projecting unit, a light-sensing unit, or the combination thereof.

15. The image display of claim 14, wherein the quantity ratio of the plurality of image display units and the at least one optical sensor is between 100 and 1000.

16. The image display of claim 10, wherein the at least one optical sensor is a fingerprint reading component.

17. The image display of claim 16, wherein the quantity ratio of the plurality of image display units and the at least one optical sensor is between 1000 and 10000.

18. The image display of claim 10, wherein the at least one optical sensor is disposed between any two adjacent image display units.

19. The image display of claim 10, wherein the image display further comprises another display module connected to the display module.

20. The image display of claim 19, wherein the another display module is a liquid crystal display panel.

21. The image display of claim 19, wherein the another display module is an organic LED panel.

\* \* \* \* \*